United States Patent [19]

Bernstein

[11] Patent Number: 4,755,785
[45] Date of Patent: Jul. 5, 1988

[54] SURFACE MOUNTED FUSE ASSEMBLY

[75] Inventor: Elliot Bernstein, Glen Cove, N.Y.

[73] Assignee: Bel Fuse Inc., Jersey City, N.J.

[21] Appl. No.: 8,480

[22] Filed: Jan. 29, 1987

[51] Int. Cl.⁴ .................... H01H 85/02; H01H 85/20
[52] U.S. Cl. .................................. 337/186; 337/213; 337/228; 361/403
[58] Field of Search ............... 337/186, 187, 188, 213, 337/222, 223, 224, 226, 228, 231, 232; 361/400, 403; 174/52 R, 138 G

[56]  References Cited
U.S. PATENT DOCUMENTS 3,684,817  8/1972  Card, Jr. et al. ................... 361/403

FOREIGN PATENT DOCUMENTS 554578   7/1943  United Kingdom ................. 337/213
2037489  6/1980  United Kingdom ................. 361/403

Primary Examiner—H. Broome
Attorney, Agent, or Firm—Ostrolenk, Faber, Gerb & Soffen

[57] ABSTRACT

A fuse assembly in which a molded cover is affixed over a standard tubular fuse. The cover is specially configured to allow the caps of the fuse to be surface mounted to solder points on a printed circuit board. The cover includes a pair of ears which contact the surface of the printed circuit board to prevent the assembly from rolling laterally. The cover has a flat face which may be printed to identify the fuse.

19 Claims, 3 Drawing Sheets

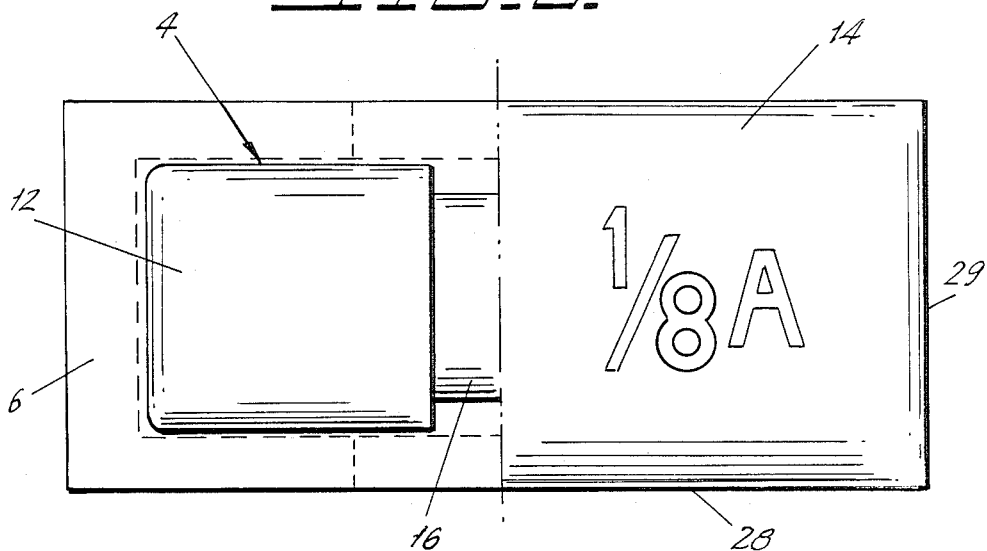
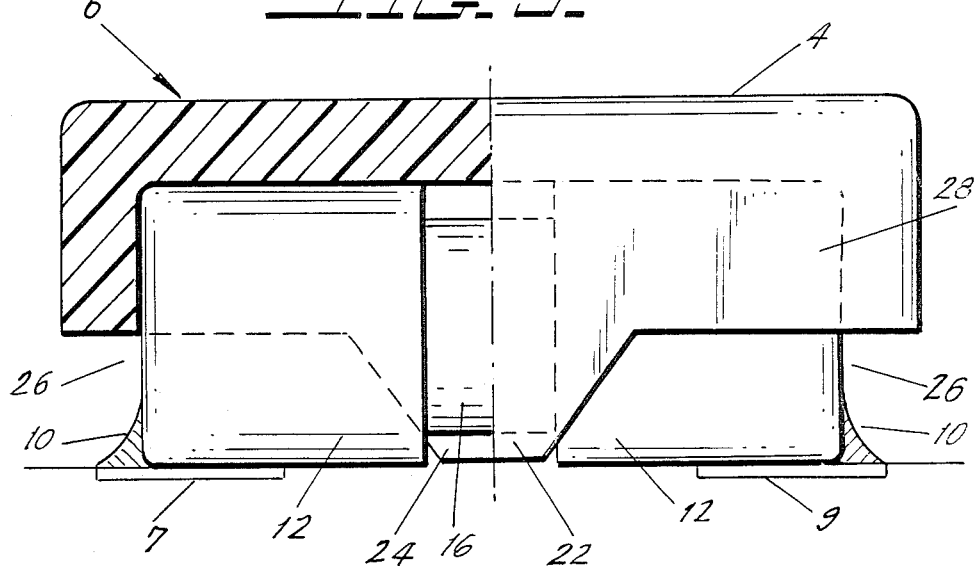

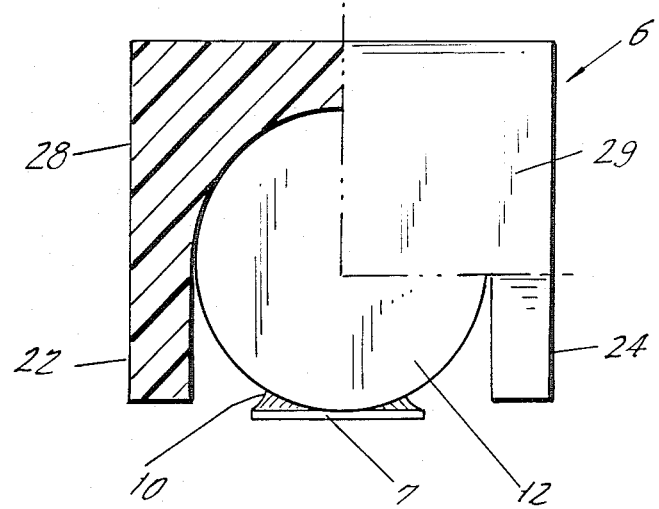
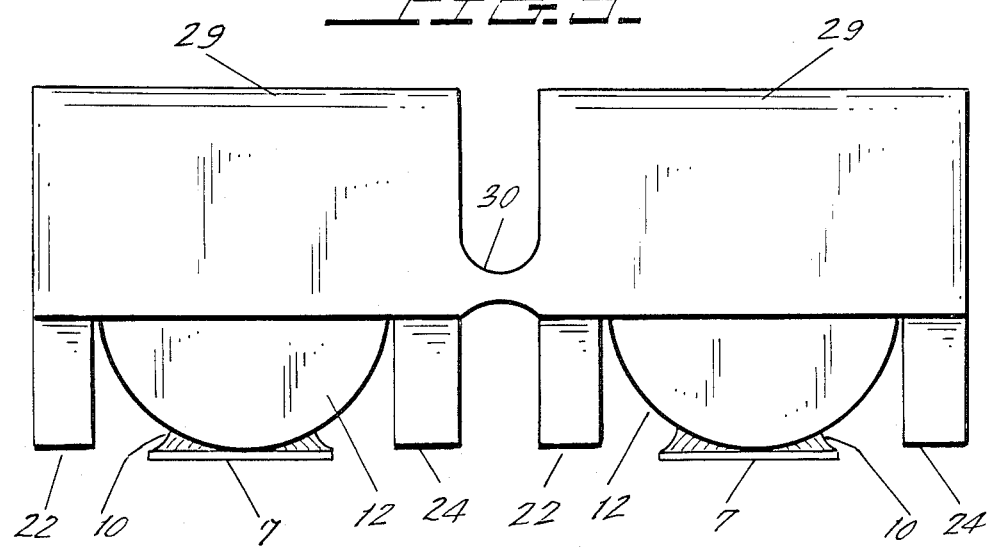

4,755,785

SURFACE MOUNTED FUSE ASSEMBLY

BACKGROUND OF THE INVENTION

1. Field of the Invention

The present invention relates to fuse assemblies, and, more particularly, to a surface mounted fuse assembly in which a molded cover is permanently affixed over a standard tubular fuse.

2. Description of the Related Art

Various surface mounting soldering techniques have been developed for attaching electrical components to printed circuit boards. Surface mounting is advantageous in that it permits denser packaging by reducing both size and bulk, and reduces costs by speeding up assembly while saving materials.

Ordinarily, the surface mounting of cylindrical components such as standard tubular fuses is accomplished by cementing the component at the appropriate location on the printed circuit board, turning the board upside down, and wave soldering the component to the board. Such a technique is effective, but the wave soldering step subjects the component to very high temperatures which may be destructive to the component.

Another problem associated with mounting a standard tubular fuse on a printed circuit board is the difficulty of labelling the component. Typically, the end caps of a fuse are engraved for identification purposes. However, if the fuse is subjected to the wave soldering technique described above, the solder fills in the engraving, making the identification label illegible.

An alternate labelling technique involves applying linear printing longitudinally across the fuse. However, if the fuse rotates at all during mounting, the label may be partially or completely hidden. Likewise, if the label is applied circumferentially around the body of the fuse, it will be partially hidden from any given viewpoint. A still further technique is to color code the fuse, but such technique is obviously quite limited in descriptiveness.

SUMMARY OF THE INVENTION

Accordingly, an object of the present invention is to provide a tubular fuse assembly in a configuration which will readily adapt to standard pick and place equipment used in surface mounting.

Another object is to provide a surface mounted fuse assembly which lends itself to the latest surface mounting soldering techniques, using solder paste and reflow soldering, rather than wave soldering, to avoid subjecting the fuse to possibly destructive high temperatures.

A further object of the present invention is to provide a surface mounted fuse assembly with a printing face that will identify the fuse and will not be obliterated during reflow soldering.

A still further object of the present invention is to provide a surface mounted fuse assembly in a configuration which will withstand short circuit tests better than conventional tubular fuses.

An even further object of the present invention is to provide a surface mounted fuse assembly in a configuration which presents the fuse to the solder points on a printed circuit board in a manner best suited to accommodate to the various surface mounted soldering techniques.

These and other objects of the present invention are achieved by providing a specially configured cover affixed to a standard tubular fuse. The cover is designed so that the caps of the fuse may be surface mounted soldered to solder points on a printed circuit board. The cover includes a pair of ears which contact the surface of the printed circuit board to prevent the assembly from rolling and to increase the stability of the device. The cover has a flat upper face opposite the printed circuit board which can be printed to identify the fuse, and which will not be obliterated during reflow soldering.

One particular advantage of the present invention is that it allows a standard fuse manufactured with existing tooling and equipment to be used for surface mounting. Thus, no modification of the fuse is required—rather, the cover of the assembly adapts the fuse so that it may be surface mounted with standard pick and place equipment.

Other features and advantages of the invention are described below, with reference to the accompanying drawings.

BRIEF DESCRIPTION OF THE DRAWINGS

FIG. 2 shows a cut-away top view of the present invention.

FIG. 3 shows a cut-away side view of the present invention.

FIG. 4 shows an end view of the present invention.

FIG. 5 shows an end view of the present invention in which two assemblies are ganged together.

DETAILED DESCRIPTION OF THE PREFERRED EMBODIMENTS

Figure 1:
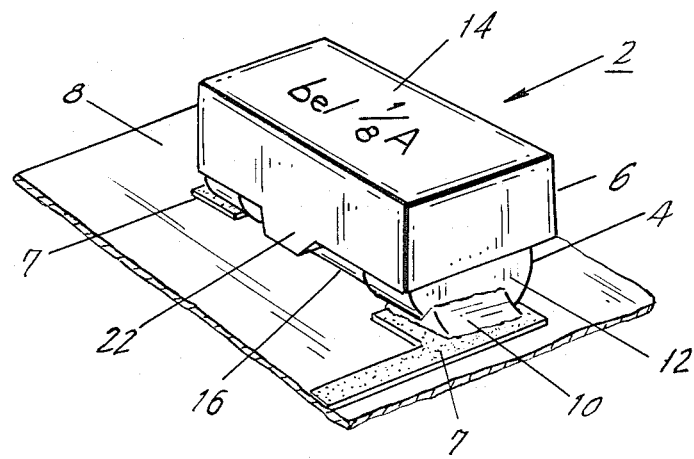
FIG. 1 shows a perspective view of the present invention surface mounted soldered on a printed circuit board.

Referring first to FIG. 1, the surface mounted fuse assembly of the present invention is shown generally by reference numeral 2. The assembly 2 is formed of a standard tubular fuse 4 provided with a suitably designed generally box shaped cover 6.

The assembly 2 is surface mounted to solder points 7 on a printed circuit board 8. In the surface mounting process, solder paste is initially screened onto the printed circuit board. Standard pick and place equipment is used to place the assembly 2 onto the appropriate solder points 7 on the circuit board 8. The circuit board with the assembly is then subjected to infrared radiation, a laser beam, or other surface mount solder methods, such as vapor phase. In any case, the applied heat causes the solder paste to flow and wick up to the end caps 12 of the fuse 4. Note that fuse 4 is subjected to much less heat in this reflow soldering process than in the wave soldering process of the prior art described above.

As shown in FIG. 1, when the assembly is mounted on a printed circuit board, a solder fillet 10 backs the end cap 12 of the tubular fuse at its bottom, while the molded cover 6 backs the cap 12 at its top. Cover 6 has a flat upper face 14 which can be printed to identify the type of fuse assembly. Advantageously, the provision of this printing face on the upper surface of the assembly prevents obliteration during reflow soldering. Cover 6 also has flat side walls that extend down partially covering over the sides and end caps of the tubular fuse within.

Referring now to the top and side views of the fuse assembly shown in FIGS. 2 and 3, it can be seen that the cover 6 is attached directly to the upper portion of the standard tubular fuse 4. The size of the fuse controls the geometry of fuse cover 6.

As shown in FIG. 3, cover 6 has a pair of ears 22, 24, one on either side of fuse 4, which extend down to the approximate level of printed circuit board 8. The ears 22, 24 increase the stability of the assembly by preventing the fuse from rolling in the lateral direction. The ears also act to reinforce the fuse assembly during short circuit tests. Advantageously, the angular shape of ears 22, 24 are designed to permit easy cleaning of the flux residue after reflow soldering.

As shown on the left side of FIG. 3, the space 26 left between cover 6 and solder fillet 10 provides access to end cap 12 of fuse 4 for test and joint inspection. The assembly is provided in a "SOIC" mounting geometry which readily adapts to standard pick and place equipment used for surface mounted assembly.

An end view of the finished assembly is shown in FIG. 4. The side walls 28 and the end walls 29 of the assembly reinforce the body. This reinforcement provided by cover 6 advantageously results in an assembly which better withstands short circuit tests.

The assembly may be provided in a discrete cavity, as shown in FIG. 4, or as a ganged cavity system as shown in FIG. 5. A "snap-off" singulation plane 30 is provided in the ganged cavity configuration to allow separation of the assemblies. Obviously, any number of assemblies of the present invention may be ganged together as shown in the manner shown in FIG. 5.

Although the present invention has been described in connection with a preferred embodiment thereof, many other variations and modifications will now become apparent to those skilled in the art. It is preferred, therefore, that the present invention be limited not by the specific disclosure herein, but only by the appended claims.

What is claimed is:

1. A surface mountable fuse assembly, comprising a cover attached to and partially covering a tubular fuse, wherein said fuse has a pair of end caps, and said cover backs only a portion of said end caps, the remaining portion of said end caps being exposed for surface mounting on solder points of a printed circuit board.

2. A surface mountable fuse assembly as recited in claim 1, wherein said cover has a pair of ears which project over respective sides of said fuse, said ears serving to prevent said assembly from rolling when said assembly is surface mounted on a printed circuit board.

3. A surface mountable fuse assembly as recited in claim 2, wherein said ears have an angular shape which permits easy cleaning of said printed circuit board after soldering.

4. A surface mountable fuse assembly as recited in claim 2, wherein said ears act to reinforce the fuse assembly during short circuit tests.

5. A surface mountable fuse assembly as recited in claim 1, wherein said cover has a flat upper face.

6. A surface mountable fuse assembly as recited in claim 5, wherein said flat upper face is printed with a label to identify said assembly.

7. A surface mountable fuse assembly as recited in claim 1, wherein said fuse has a pair of end caps, said cover partially covers said ends caps, said cover reinforcing the fuse assembly during short circuit tests.

8. A surface mountable fuse assembly as recited in claim 1, wherein said assembly is of a SOIC mounting geometry.

9. A surface mountable fuse assembly as recited in claim 1, wherein said fuse comprises a tube with a pair of end caps.

10. A surface mountable fuse assembly as recited in claim 2, wherein said cover is generally box shaped and flat sided.

11. A surface mountable fuse assembly, comprising a cover permanently affixed over a plurality of tubular fuses arranged side by side, each fuse having end caps, wherein said cover backs only a portion of said end caps, the remaining portion of said end caps being exposed for surface mounting on solder points of a printed circuit board, and wherein a snap-off singulation is provided in said cover between said fuses to allow separation of said assembly into a plurality of neighboring assemblies, each comprising at least one fuse and a respective individual cover thereover.

12. A surface mountable fuse assembly as recited in claim 11, wherein said cover has a plurality of ears which project over the respective sides of each of said fuses, said ears serving to prevent said assembly from rolling when said assembly is surface mounted on a printed circuit board.

13. A surface mountable fuse assembly as recited in claim 12, wherein said ears act to reinforce the fuse assembly during short circuit tests.

14. A surface mountable fuse assembly as recited in claim 12, wherein said ears have an angular shape which permits easy cleaning of printed circuit board.

15. A surface mountable fuse assembly as recited in claim 11, wherein said cover has a plurality of flat upper faces, one for each fuse.

16. A surface mountable fuse assembly as recited in claim 15, wherein said upper faces are printed with respective labels to identify said respective fuses.

17. A surface mountable fuse assembly as recited in claim 11, wherein said cover partially covers said end caps, said cover reinforcing the fuse assembly during short circuit tests.

18. A surface mountable fuse assembly as recited in claim 11, wherein each of said plurality of assemblies have a SOIC mounting geometry.

19. A surface mountable fuse assembly as recited in claim 12, wherein each said cover is generally box shaped and flat sided.

* * * * *